(12) United States Patent
Rombach et al.

(10) Patent No.: US 6,590,458 B2
(45) Date of Patent: Jul. 8, 2003

(54) CLOCK GENERATOR CIRCUIT WITH A PLL HAVING AN OUTPUT FREQUENCY CYCLED IN A RANGE TO REDUCE UNWANTED RADIATION

(75) Inventors: Gerd Rombach, Freising (DE); Hermann Seibold, Amper (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/970,205

(22) Filed: Oct. 3, 2001

(65) Prior Publication Data

US 2003/0062956 A1 Apr. 3, 2003

(30) Foreign Application Priority Data

Oct. 6, 2000 (DE) .......................... 100 49 531

(51) Int. Cl.$^7$ .............. H03L 7/00; H03B 5/24
(52) U.S. Cl. .............. 331/2; 331/17; 331/57; 331/177 R; 331/179; 327/156
(58) Field of Search .............. 331/1 A, 2, 8, 331/17, 18, 25, 57, 179, 177 R; 327/156–159; 360/51; 375/396; 455/260

(56) References Cited

U.S. PATENT DOCUMENTS 4,565,976 A * 1/1986 Campbell .................. 326/126

FOREIGN PATENT DOCUMENTS

DE 197 32 142 A1 6/1998
JP 05268002 10/1993

* cited by examiner

*Primary Examiner*—David C. Mis
(74) *Attorney, Agent, or Firm*—Bret J. Petersen; W. James Brady, III; Frederick J. Telecky, Jr.

(57) ABSTRACT

A clock generator including a PLL circuit serves to generate an output frequency cycled in a predefined range and containing a desired clock frequency. The PLL circuit contains a voltage-controlled oscillator (18), the oscillating frequency of which is adjustable by means of an analog control voltage to the desired clock frequency in a fixed relationship to a reference frequency applied to the PLL circuit. The clock generator contains a second voltage-controlled oscillator (22), the oscillating frequency of which can be cycled in the predefined range. The second oscillator (22) is configured so that its oscillating frequency can be varied by means of a digital incrementally variable control signal in the predefined range. By varying the output frequency of the clock generator a spreading of its output frequency spectrum is attainable, resulting in a reduction in high-frequency interference by the signal generated by the clock.

3 Claims, 2 Drawing Sheets

CLOCK GENERATOR CIRCUIT WITH A PLL HAVING AN OUTPUT FREQUENCY CYCLED IN A RANGE TO REDUCE UNWANTED RADIATION

FIELD OF THE INVENTION

The invention relates to a clock generator including a PLL circuit for generating an output frequency cycled in a predefined range containing a desired basic clock frequency, the PLL circuit containing a voltage-controlled oscillator, the oscillating frequency of which is adjustable by means of an analog control voltage to the desired clock frequency in a fixed relationship to a reference frequency applied to the PLL, and including a second voltage-controlled oscillator the oscillating frequency of which can be cycled in the predefined range.

BACKGROUND OF THE INVENTION

A clock generator of this kind is known from EP 0 739 089 A2. In this known clock generator the two voltage-controlled oscillators receive a control signal which sets them to a clock frequency defined in relationship to the reference frequency applied to the PLL. However, the second voltage-controlled oscillator receives an additional control voltage which is added to the first-mentioned control voltage. The two control voltages are analog voltage values which prior to being applied to the second voltage-controlled oscillator are added in an analog adding circuit. The additional control voltage is varied in accordance with a predefined memorized profile whereby the memorized digital values representing the desired variation profile are converted into analog values and applied to the adder. By sequentially applying the memorized digital values to the digital/analog converter and to the adder the output frequency of the second voltage-controlled oscillator can be varied over a desired range which then contains the clock frequency set with the aid of the control voltage applied to the two voltage-controlled oscillators.

With the aid of such a clock generator the object is to spread the spectrum of the output frequencies generated by the clock generator so that electromagnetic interference is reduced as generated by high-frequency clock generators whose output signal is set in frequency. By varying the clock frequency over a predefined range the energy radiated by the clock generator is distributed over a larger spectral range and thus reduced at the individual frequency lines.

In the known clock generator, varying the output frequency of the second voltage-controlled oscillator is achieved by superimposing its analog control voltage with a variable, likewise analog control voltage by addition. For this purpose the clock requires a digital/analog converter and an analog adding circuit. At high clock frequencies, however, the circuitry needed for an analog adding circuit becomes very complicated when taking into account that the voltages employed are in the microvolt range. Furthermore, it is difficult with the known clock generator to set the two voltage-controlled oscillators to the same clock frequency since the second oscillator to which the control voltage generated by the PLL is not applied directly but as a component of the output voltage of the adder results in any errors occurring in the adder also resulting in a wrong setting of the clock frequency. In the known clock generator the desired range for changing the clock frequency strived by varying the control voltage applied to the second oscillator via the adder applies only for a specific clock frequency. Any change in the clock frequency in no change in the range in which the absolute frequency values is varied, meaning that the percentual deviation as regards the clock frequency differs from frequency to frequency. This is a nuisance, however, since this results in the wanted optimum spreading of the spectrum for reducing the unwanted radiation being set only for a highly specific clock frequency.

SUMMARY OF THE INVENTION

The invention is based on the object of configuring a clock generator of the aforementioned kind so that with a simplified configuration an optimum reduction in the unwanted radiation is attained irrespective of the clock frequency set in each case.

In an embodiment of the invention the second oscillator is configured so that its oscillating frequency can be varied by means of a digital incrementally variable control signal in the predefined range.

In the clock generator in accordance with the invention the oscillating frequency of the second voltage-controlled oscillator can be varied with the aid of the digital control signals directly applied thereto, it thus now no longer being necessary to convert this digital control signal via a digital/analog converter into a analog signal and then to add it to the analog control signal generated by the PLL for then controlling the second oscillator by this sum signal.

In other embodiments, the second oscillator consists of 2n+1 negator stages cascaded as a kind of ring oscillator which delay the signal passing through them by a constant value in each case and that the signal can be delayed by variable values in one of the negator stages in addition to the constant delay value by means of the digital control signal.

In another embodiment it is provided for that each negator stage contains an n-channel MOSFET and a p-channel MOSFET in series therewith, the gates of which are interconnected, that to each series circuit of the two MOSFETs a further p-channel MOSFET is connected in series, to the gate of which the analog control voltage is applied to control the current flowing through the series circuit, and that in the one negator stage parallel to the further p-channel MOSFET additional p-channel MOSFETs are connected in parallel, to the gates of which digital signals for varying the current flowing through the series circuit in this negator stage can be applied.

BRIEF DESCRIPTION OF THE DRAWINGS

Further advantages and details of the invention read from the following description with reference to the attached drawing in which.

DETAILED DESCRIPTION OF THE EMBODIMENTS

Figure 1:
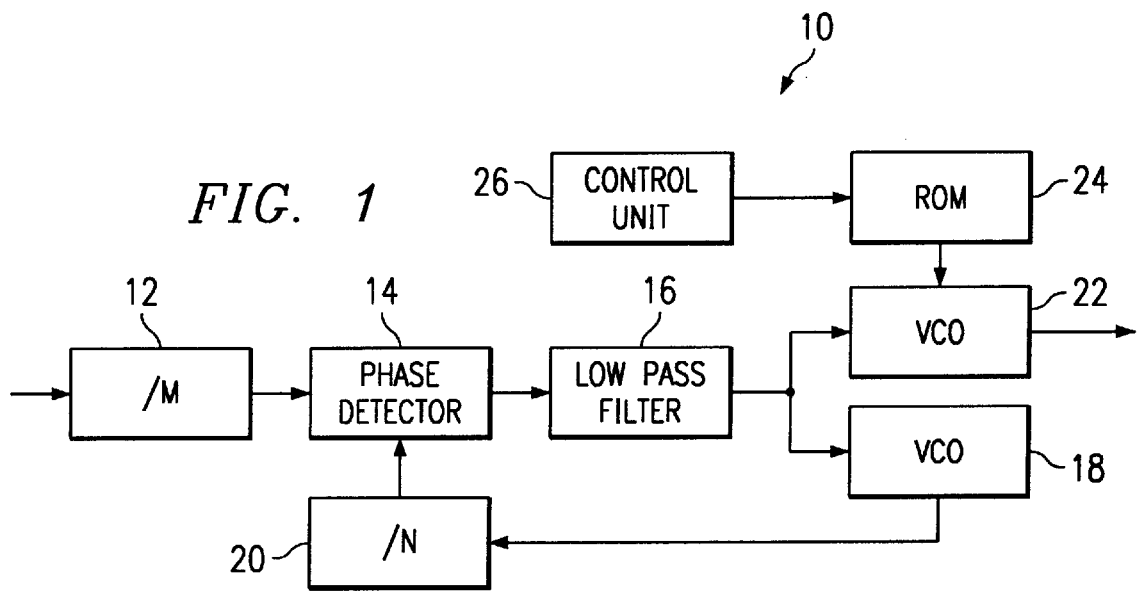
FIG. 1 is a block diagram of the clock generator in accordance with the invention.

Referring now to FIG. 1 there is illustrated the clock generator 10 containing a conventional PLL circuit including a frequency divider 12, a phase detector 14, a low-pass filter 16, a voltage-controlled oscillator 18 and a further frequency divider 20. As evident from FIG. 1 a reference frequency fr is applied to the frequency divider 12 which divides this frequency by the given factor M. The phase detector 14 compares the phase of the output signal of the frequency divider 12 to the phase of the output 10 signal of the frequency divider 20 which divides the frequency of the output signal of the voltage-controlled oscillator 18 by the factor N. The output signal of the phase detector which is proportional to the difference in phase of the signals compared is sent through the low-pass filter 16, the output signal of which represents an analog control voltage for the voltage-controlled oscillator 18. The effect of this PLL is to control the output frequency of the oscillator 18 to a value corresponding to the product of the reference frequency fr and the ratio of the dividing factors N/M.

The output voltage of the low-pass filter 16 representing the analog control voltage for the oscillator 18 also controls a second voltage-controlled oscillator 22 in the 25 same way as the oscillator 18. The two oscillators 18 and 22 are configured the same in principle. Both can be set with the aid of the analog control voltage to a clock frequency, the oscillator 22, however, containing additional components, with the aid of which its frequency can be varied by digital control signals.

Due to the special configuration of the voltage-controlled oscillator 22 to be detailed with reference to FIGS. 2 and 3 the oscillating frequency of this oscillator can be varied by directly applying digital signals from a ROM 24. Applying the digital control signals is controlled with the aid of a control unit 26. The control unit 26 ensures that the digital signals memorized in the ROM 24 are applied in a cycle sequentially to the oscillator 22 so that the output frequency thereof is likewise cycled in a range containing the clock frequency set with the aid of the 10 control voltage from the low-pass filter 16.

Figure 2:
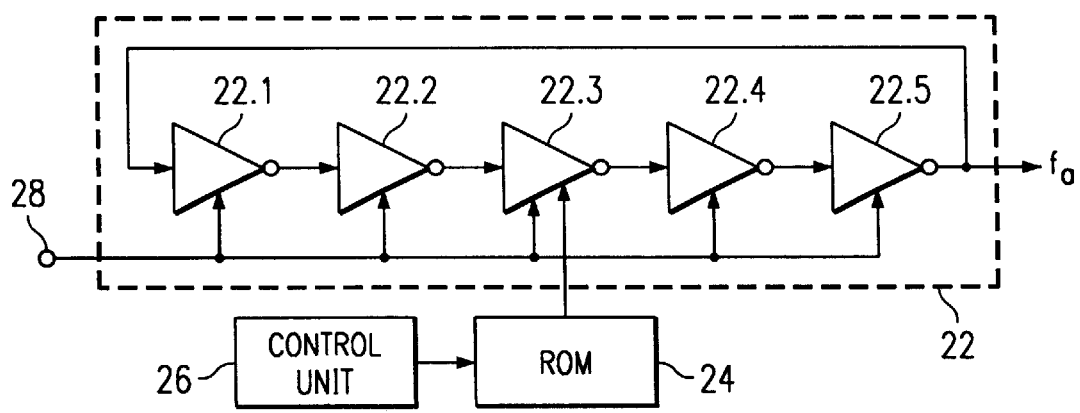
FIG. 2 is a schematic diagram illustrating the configuration of the second voltage-controlled oscillator and FIG. 3 is a circuit diagram of the oscillator as shown in FIG. 2.

Referring now to FIG. 2 there is illustrated the basic configuration applied of the oscillator 22 which, as evident, consists of a cascade arrangement of five negator 15 stages 22.1, 22.2, 22.3, 22.4 and 22.5 as a kind of ring oscillator. In this cascade arrangement the output of one negator circuit is connected to the input of the next negator circuit whilst the output of the last negator circuit 22.5 is connected to the input of the first negator 20 circuit 22.1 in forming a ring. The analog control voltage generated in the PLL is applied to the input 28 of the oscillator 22. The negator circuit 22.3 can be influenced by additional control signals from the ROM 24 which is controlled by the control unit 26. The salient parameter dictating the oscillating frequency of the oscillator 22 is the propagation delay which the signals experience in passing through the individual negator circuits. In the negator circuits 22.1, 22.2, 22.4 and 22.5 this propagation delay is set fixed by the analog control voltage applied to 30 the input 28, whereby in the negator circuit 22.2 too, a basic setting of the propagation delay is undertaken by this control voltage. The digital control signals applied from the ROM 24 to the negator circuit 22.3 influence the propagation delay to thus permit varying the oscillating frequency of the oscillator 22.

Figure 3:
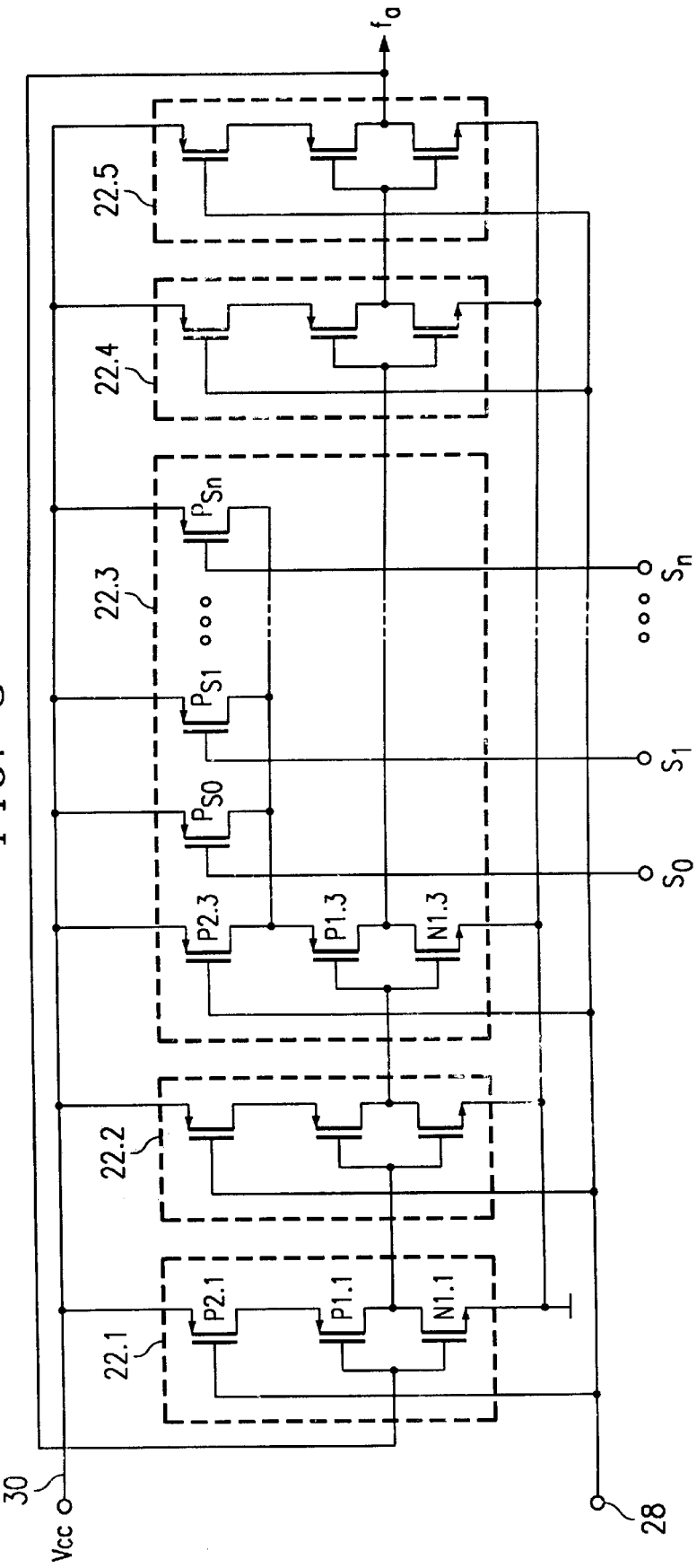

Referring now to FIG. 3 there is illustrated the circuitry configuration of the oscillator 22 in detail, it being evident that each of the negator circuits 22.1, 22.2, 22.4 and 22.5 is configured the same, whilst negator circuit 22.3 contains additional circuit elements to which the control signals can be applied from the ROM 24. The basic configuration of each negator circuit will now be detailed by way of the negator circuit 22.1. This negator circuit contains a n-channel MOSFET N1, a p-channel MOSFET P1 connected in series thereto as well as a further p-channel MOSFET P2. The gates of the two MOSFETs N1 and P1 connected in series, like their drains, are connected to each other. The source-drain path of the MOSFET P2 is located between a supply voltage conductor 30 and the source of the MOSFET P1. The gate of the MOSFET P2 is connected to the input 28 to which the analog control voltage from the PLL can be applied. The MOSFET P2 acts in the negator circuit as a current source, the analog control voltage determining at its gate the current flowing there through. It is by adjusting this current that the propagation delay of the negator circuits can be set as the factor determining the frequency of the oscillator formed by the cascade arrangement of the negator circuits. The cascade arrangement materializes from the connected drains of the negator circuits being connected to the connected gates of the next negator circuit whilst the connected drains of the last negator circuit 22.5 are connected to the connected gates of the first negator circuit 22.1 to close the ring. The sources of all n-channel MOSFETs are grounded whilst the sources of all p-channel MOSFETs acting as current sources are connected to the supply voltage conductor 30.

In the negator circuit 22.3 further p-channel MOSFETs PS0, PS1 . . . PSn are connected in parallel to the p-channel MOSFETs acting as the current source MOSFET P2.3. By applyig digital control signals to the inputs S0, S1 . . . Sn and the gates of the MOSFETs PS0, PS1 . . . PSn thus connected thereto these can be likewise switched ON/OFF as transistors acting as the current source. Depending on how many of the additional transistors are switched ON the propagation delay of the negator circuit 22.3 becomes faster or slower to thus permit influencing the oscillating frequency of the oscillator 22. When, for example, one transistor after the other is switched ON by the control signals, then the oscillating frequency of the oscillator 22 is incremented higher starting from the clock frequencies established by the control voltage at input 28.

The control signals are applied to the inputs S0, S1 . . . Sn as controlled by the control unit 26 from the ROM 24. With the aid of the digital values memorized in the ROM 24 it can thus be established how the oscillating frequency of the oscillator 22 is changed on application of a group of the control signals consisting of n bits to the inputs S0 to Sn. By cyclic application of the control signal groups memorized in the ROM 24 the oscillating frequency of the oscillator 22 can be cycled.

It will be appreciated that it is now possible to influence the modulation profile of the oscillating frequency of the oscillator 22 very simply by means of the control signal groups. Depending on the data values of the individual control signal groups held in the ROM 24, the oscillating frequency can be changed to achieve a desired modulation profile of the desired clock frequency to thus obtain the energy distribution in the spectrum of the generated output signal of the clock prompting minimum high-frequency interference.

One particular advantage afforded by a clock generator equipped with an oscillator designed as shown in FIG. 3 is that for each clock frequencies generated the same percentual change in frequency relative to this clock frequency for widening the spectrum is achievable with the aid of the digital control signals in thus obtaining always the same optimum widening of the frequency spectrum and thus the same reduction in the high-frequency interference generated for each of the various clock frequencies generated.

With the same configuration of the two oscillators 18 and 22 it can now be assured that both oscillate at the same clock rate set with the aid of the control voltage generated in the PLL. This control voltage is applied directly to the two oscillators without it being influenced by further circuit units. Influencing the oscillating frequency of the oscillator 22 with the aid of the digital signals has no effect on the clock frequency set by the control voltage at the input 28, thus ensuring that the desired clock frequencies is reliably obtained in the range of variation caused by the digital control signals.

What is claimed is:

1. A clock generator including a PLL circuit for generating an output frequency cycled in a predefined range containing a desired clock frequency, said PLL circuit containing a voltage-controlled oscillator, the oscillating frequency of which is adjustable by means of an analog control voltage to the desired clock frequency in a fixed relationship to a reference frequency applied to said PLL circuit, and including a second voltage-controlled oscillator, the oscillating frequency of which can be cycled in the predefined range, characterized in that said second oscillator is configured so that its oscillating frequency can be varied to a plurality of frequencies by means of a digital incrementally variable control signal having n bits (where n is greater than 1) in said predefined range.

2. The clock generator as set forth in claim 1, characterized in that said second oscillator consists of a plurality of negator stages cascaded as a kind of ring oscillator which delay the signal passing through them by a constant value in each case and that said signal can be delayed by variable values in one of said negator stages in addition to said constant delay value by means of said digital control signal.

3. The clock generator as set forth in claim 2, characterized in that each negator stage contains an n-channel MOSFET and a p-channel MOSFET in series therewith, the gates of which are interconnected, that to each series circuit of said two MOSFETs a further p-channel MOSFET is connected in series, to the gate of which said analog control voltage is applied to control the current flowing through said series circuit, and that in said one negator stage parallel to said further p-channel MOSFET additional p-channel MOSFETs are connected in parallel, to the gates of which digital signals for varying said current flowing through said series circuit in this negator stage can be applied.

* * * * *